(12) United States Patent
Yokoyama et al.

(10) Patent No.: US 9,426,934 B2
(45) Date of Patent: Aug. 23, 2016

(54) SHIELD CASE AND ELECTRONIC APPARATUS

(71) Applicant: TDK CORPORATION, Tokyo (JP)

(72) Inventors: Takeshi Yokoyama, Tokyo (JP); Hideki Kachi, Tokyo (JP); Shinichi Tsuchiya, Tokyo (JP)

(73) Assignee: TDK CORPORATION, Tokyo (JP)

( * ) Notice: Subject to any disclaimer, the term of this patent is extended or adjusted under 35 U.S.C. 154(b) by 40 days.

(21) Appl. No.: 14/388,924

(22) PCT Filed: Apr. 5, 2013

(86) PCT No.: PCT/JP2013/060430
§ 371 (c)(1),
(2) Date: Sep. 29, 2014

(87) PCT Pub. No.: WO2013/151152
PCT Pub. Date: Oct. 10, 2013

(65) Prior Publication Data
US 2015/0062809 A1   Mar. 5, 2015

(30) Foreign Application Priority Data
Apr. 6, 2012   (JP) .................................. 2012-087554

(51) Int. Cl.
*H05K 9/00* (2006.01)

(52) U.S. Cl.
CPC .................................. *H05K 9/0028* (2013.01)

(58) Field of Classification Search
CPC . H05K 9/0024; H05K 9/0026; H05K 9/0049; H05K 9/0052

USPC .............................. 361/800, 818; 174/50, 51
See application file for complete search history.

(56) References Cited

U.S. PATENT DOCUMENTS 5,895,884 A * 4/1999 Davidson ............. H05K 9/0032
174/366
6,947,295 B2 * 9/2005 Hsieh ................... H01L 23/3128
174/260

FOREIGN PATENT DOCUMENTS

| JP | 2000-101278   | 4/2000  |
| JP | 2000-101278 A | 4/2000  |
| JP | 2009-117773   | 5/2009  |
| JP | 2009-117773 A | 5/2009  |
| JP | 2011-249689   | 12/2011 |
| JP | 2012-253214   | 12/2012 |
| JP | 2012-253214 A | 12/2012 |

OTHER PUBLICATIONS

International Preliminary Report on Patentability dated Oct. 16, 2014 and translation of the Written Opinion of the International Searching Authority dated May 14, 2013 in related application serial No. PCT/JP2013/060430.

* cited by examiner

*Primary Examiner* — Tuan T Dinh
*Assistant Examiner* — Mukund G Patel
(74) *Attorney, Agent, or Firm* — Young Law Firm, P.C.

(57) ABSTRACT

A shield case 10 has, disposed upon a lateral plate 12, a first anchor part 123 for anchoring to a substrate, and a slit 127 which extends from a release edge part to a top plate 11, whereupon a leading end portion 127a thereof is formed upon the top plate 11.

6 Claims, 4 Drawing Sheets

SHIELD CASE AND ELECTRONIC APPARATUS

TECHNICAL FIELD

The present invention relates to a shield case formed into box-like shape and one end being opened having a top plate and side plates in which a part of opened edges of the side plates axe fixed to a substrate on which electronic parts are mounted, and relates to an electronic apparatus using the shield case.

BACKGROUND ART

During use of an electronic apparatus incorporating a substrate on which electronic parts are mounted, especially a mobile device such as a mobile phone having high portability, a user may drop involuntarily this electronic apparatus. When the mobile device drops and hits against a floor surface, a motherboard incorporated in the mobile device may be significantly distorted, and the electronic parts on the motherboard may be separated therefrom. Thus, the electronic parts used in the mobile device are required to ensure peeling strength withstanding the distortion of the motherboard caused by a drop impact.

A mechanism of the separation of the electronic parts due to the distortion of the motherboard is that the electronic parts are not distorted even though the motherboard is distorted, stress thereof concentrates on a terminal connecting the electronic parts and motherboard, whereby the terminal or a portion around the terminal is damaged. On the basis of the mechanism, as a method of enhancing the peeing strength, there is a method that reduces rigidity of the electronic parts so that the electronic parts easily follow the distortion of the motherboard. In a module including a resin substrate, electronic parts mounted on the resin substrate, and a shield case disposed on the substrate so as to cover the electronic parts, the rigidity thereof is determined by a structure of the shield case, so that it is possible to enhance the peeling strength by optimizing the structure of the shield case.

The following Patent Document 1 discloses a shield case formed into a box-like shape and one end being opened having a top plate and side plates, and put on a substrate housed in a casing of an electronic apparatus in such a manner that opened edges of the side plates are brought into contact with a ground pattern formed on the substrate. In this shield case, a plurality of slits are formed so as to face the opened edge of each side plate and to divide the side plate into a plurality of sections.

CITATION LIST

Patent Document

Patent Document 1: Japanese Patent Application Laid-open No. 2000-101278

SUMMARY OF INVENTION

Technical Problem to be Solved by Invention

The technique described in the Patent Document 1 can make the module so as to withstand a certain degree of the drop impact. However, it cannot be said that followability to a deformation of the mother board such as a complicated distortion is sufficient.

The present invention has been made in view of the above problem, and an object thereof is to provide a shield case capable of following also the distortion of a substrate to which the shield case is fitted and a module using the shield case.

Means for Solving Problem

To solve the above problem, a shield case according to the present invention is formed into a box-like shape and one end being opened having a top plate and a side plate, in which a part of an opened edge of the side plate is fixed to a substrate on which electronic parts are mounted, wherein the side plate has a fixing portion for fixing to the substrate, and a slit extending from the opened edge to the top plate and having a tip portion forced in the top plate.

According to the present invention, the silt extends from the opened edge of the side plate up to the top plate, and the tip portion of the slit is formed in the top plate, so that even if the substrate to which the shield case is fitted is distorted, the top plate easily follows the distortion, and a module easily follows distortion of a motherboard. As a result, stress applied to a terminal of the module is reduced, thereby enhancing peeling strength of the module.

Preferably, in the shield case according to the present invention, the tip portion is formed into a circular arc. In this preferred embodiment, by forming the tip portions into a circular arc shape, it is possible to reduce stress concentration on the tip portion, and to prevent damage due to metal fatigue even if the distortion repeatedly occurs.

Preferably, in the shield case according to the present invention, a plurality of the side plates are provided, and adjacent side plates are spaced apart from each other to form a gap therebetween. In this preferred embodiment, even if the shield case is significantly distorted, the formation of the gap between the adjacent side plates allows the adjacent side plates to foe shifted from each other, thereby suppressing damage of the side plates.

Preferably, in the shield case according to the present invention, at least one pair of the slits is formed, and the fixing portion is provided in a position sandwiched between the pair of slits in the side plate. In this preferred embodiment, the silts are formed on both sides of the fixing portion for fixing the shield case to the substrate, so that even if the substrate is distorted, the shield case easily follows the distortion, thereby reducing rigidity of the module.

Preferably, in the shield case according to the present invention, the fixing port ion includes a first fixing portion provided in a center portion of the side plate. A displacement amount caused due to distortion of the substrate is the smallest in the vicinity of the center of one side of the substrate. Thus, when the shield case is fixed to the substrate at this portion, influence on the distortion of the substrate that the rigidity of the shield case exerts can be reduced. As a result, it is possible to fix the shield case to the substrate without involving an increase in the rigidity of the module.

Preferably, in the shield case according to the present invention, second fixing portion and third fixing portion are formed so as to sandwich the first fixing portion therebetween in an extending direction of the side plate. In this preferred embodiment, in addition to the above arrangement of the first fixing portion, forming of the second fixing portion and third fixing portion so as to sandwich the first fixing portion therebetween allows more secure fixing of the shield case to the substrate.

Preferably, in the shield case according to the present invention, a slit is formed between the second fixing portion and a gap and a slit is also formed between the third fixing portion and a gap. In this preferred embodiment, even if a corner portion of the shield case is deformed, force to be applied to the second fixing portion and third fixing portion can be reduced.

Preferably, in the shield case according to the present invention, a first connecting portion is formed at an end portion of the first fixing portion on a side opposite to the top plate, a second connecting portion is formed at an end portion of the second fixing portion on a side opposite to the top plate, and a third connecting portion is formed at an end portion of the third fixing portion on a side opposite to the top plate, a length of a portion of the first connecting portion that is arranged along the substrate is longer than a length of a portion of the second connecting portion that is arranged along the substrate and a length of a portion of the third connecting portions that is arranged along the substrate.

In this preferred embodiment, a length of a portion of the first connecting portion that is arranged along the substrate is configured to be longer than a length of a portion of the second connecting portion, that is arranged along the substrate and a length of a portion of third connecting portion that is arranged along the substrate. Thus, it is possible to achieve both fixation strength of the shield case to the substrate and suppression of excessive enhancement of rigidity of the shield cased.

Preferably, in the shield case according to the present invention, a corner portion of any of the first connecting portion, the second connecting portion, and the third connecting portion is formed into a circular arc shape so as to retreat toward the top plate side in a surface perpendicular to the substrate. In this preferred embodiment, it is possible to achieve both reduction in the stress concentration which is brought about by forming the corner portion info a circular arc shape, and solder wetting-up uniformization effect which is brought about by forming the circular arc such that the circular arc retreats to the top plate side in a surface perpendicular to the substrate.

Preferably, in the shield case according to the present invention, both the second connecting portion and third connecting portion are disposed so as to be closer to a gap side. In this preferred embodiment, a distance between the second connecting portion and third connecting portion can be secured. Thus, it is possible to achieve assurance of stability of a fixing state of the shield case and to improve resistance to pressure applied from an upper surface of the shield case during mounting and the like.

Preferably, in the shield case according to the present invention, the second connecting portion and the third connecting portion are provided to be positioned inside the outermost part of a terminal electrode disposed on a rear surface of the substrate. In this preferred embodiment, when the substrate is distorted with the distortion of the motherboard, it is possible to prevent stress due to influence of the distortion from being transmitted to the second connecting portion and the third connecting portion.

An electronic apparatus according to the present invention is a device in which the above-described shield case is disposed on the substrate on which electronic parts are mounted so as to cover the electronic parts. In the present invention, there can be provided an electronic apparatus having characteristics of the above-described shield case.

Advantageous Effects of Invention

According to the present invention, there can be provided a shield case capable of following also the distortion of a substrate to which the shield case is fitted and an electronic apparatus using the shield case.

MODE FOR CARRYING OUT THE INVENTION

Figure 1A:
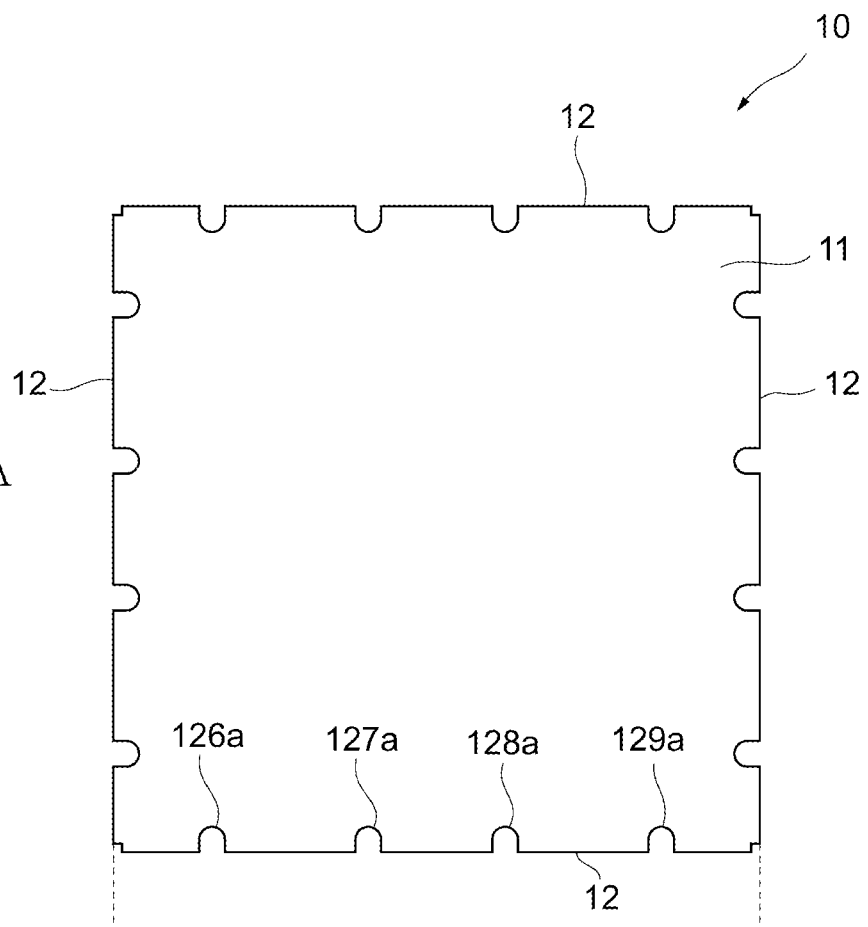
FIGS. 1A and 1B are views each illustrating a shield case which is an embodiment of the present invention.

An embodiment of the present invention will be described below with reference to the accompanying drawings. For easy understanding of explanation, in each drawing, the same reference numerals are affixed to the same components as much as possible, and redundant descriptions thereof are omitted.

Figure 1B:
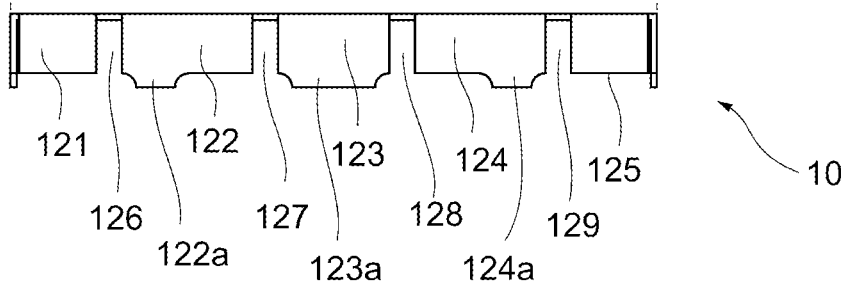

A shield case which is an embodiment of the present invention will be described with reference to FIGS. 1A and 1B. FIGS. 1A and 1B are views each illustrating a shield case 10 which is an embodiment of the present invention. FIG. 1A is a plan view of the shield case 10, and FIG. 1B is a side view of the shield case 10.

The shield case 10 has a top plate 11 and four side plates 12. The top plate 11 has a substantially rectangular shape, and the four side plates 12 are provided to extend from individual sides of the top plate 11 in the same direction which is perpendicular to the top plate 11. Thus, the shield case 10 is formed into a box-like shape and one end being opened having the top plate 11 and side plates 12. In the shield case 10, a part of an opened edge (edge portion of the side plate 12 on a side opposite to a side on which the side plate 12 is connected to the top plate 11) of the side plate 12 is fixed to a substrate on which electronic parts are mounted.

In FIG. 1B, the side plate 12 has a side end portion 121, a second fixing portion 122, a first fixing portion 123, a third fixing portion 124, and a side end portion 125 in the order from one end towards the other end. A silt 126 is formed between the side end portion 121 and second fixing portion 122. A slit 127 is formed between the second fixing portion 122 and first fixing portion 123. A slit 128 is formed between the first fixing portion 123 and third fixing portion 124. A slit 129 is formed between the third fixing portion 124 and side end portion 125.

Thus, the side plate 12 has the first fixing portion 123, second fixing portion 122, and third fixing portion 124 which are a fixing portion for fixing to the substrate, and slits 126, 127, 128 and 129 extending from the opened edge to the top plate 11.

A tip portion 126a of the slit 126 is formed in the top plate 11. Thus, the silt 126 is connected from the opened edge to the top plate 11. Similarly, a tip portion 127a of the slit 127 is formed in the top plate 11, a tip portion 128a of the slit 123 is formed in the top plate 11, and a tip portion 129a of the slit 129 is formed in the top plate 11.

By adopting such a configuration, the slits 126, 127, 128, and 129 extending from the opened edge of the side plate 12 reach the top plate 11, and the tip portions 126a, 127a, 128a, and 129a of the slits 126, 127, 128, and 129 are formed in the top plate 11. Therefore, even if the substrate to which the shield case 10 is fitted is distorted, the top plate 11 easily follows the distortion.

Further, in the present embodiment, the tip portions 126a, 127a, 128a, and 129a are formed into a circular arc shape. In this manner, by forming the tip portions 126a, 127a, 128a, and 129a into a circular arc shape, it is possible to reduce stress concentration on the tip portions 126a, 127a, 128a, and 129a, and to prevent damage due to metal fatigue even if the distortion repeatedly occurs.

Figure 2:
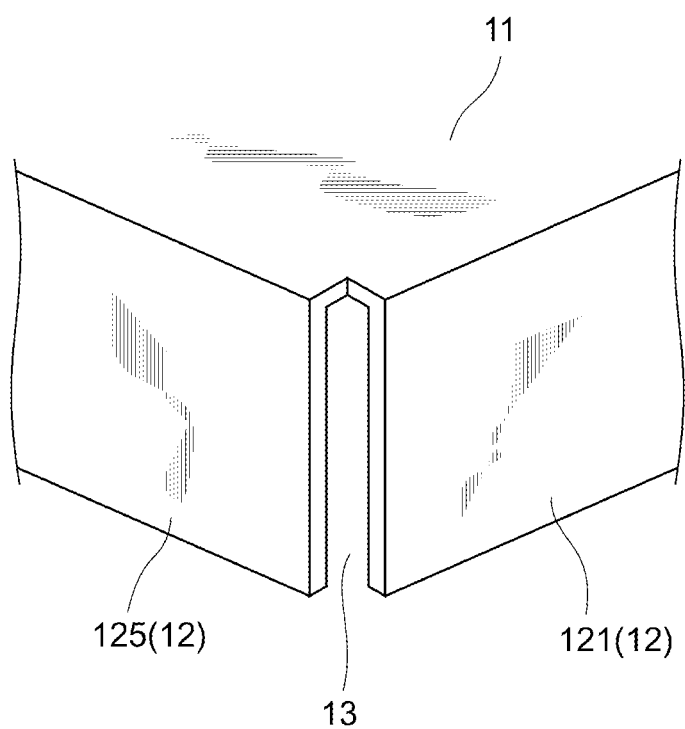
FIG. 2 is a view illustrating a gap formed between adjacent side plates shown in FIGS. 1A and 1B.

Further, in the present embodiment, a plurality of the side plates are provided, and adjacent side plates 12 and 12 are spaced apart from each other to form a gap therebetween. An embodiment of the formation of this gap will be described with reference to FIG. 2. FIG. 2 is a fragmentary perspective view illustrating a gap 13 formed between the adjacent side plates 12 and 12.

As illustrated in FIG. 2, the adjacent side plates 12 and 12 are spaced apart from each other to form the gap 13 therebetween. More specifically, the side end portion 121 of the one side plate 12 and the side end portion 125 of the other side plate 12 are spaced apart from each other to form the gap 13. With this configuration, even if the shield case 10 is significantly distorted, the adjacent side plates 12 and 12 are allowed to be shifted from each other, thereby suppressing damage of the side plates 12.

Further, in the present embodiment, at least one pair of the slits is formed, and the fixing portion is provided at a position sandwiched between the pair of slits in the side plate. Specifically, the second fixing portion 122 which is a fixing portion is formed between the slits 126 and 127 which is a pair of slits. Similarly, the first fixing portion 123 is formed between the pair of slits 127 and 128, and the third fixing portion 124 which is a fixing portion is formed between the slits 128 and 129 which is a pair of slits. In this manner, since the slits 126, 127, 128, and 129 are formed on both sides of the fixing portions 123, 122, and 124 which are fixing portions for fixing the shield case 10 to the substrate, the shield case 10 easily follows the distortion even if the substrate is distorted.

Further, in the present embodiment, the first fixing portion 123 is provided in a center portion of the side plate 12. A displacement amount caused due to distortion of the substrate is the smallest in the vicinity of the center of one side of the substrate. Thus, when the shield case 10 is fixed to the substrate at this portion, influence on the distortion of the substrate that the rigidity of the shield case exerts can be reduced. By fixing the shield case 10 to the substrate at the first fixing portion 123 formed in the center portion of the side plate 12, it is possible to fix the shield case 10 to the substrate without involving an increase in the rigidity of the module.

Further, in the present embodiment, the second fixing portion 122 and third fixing portion 124 are provided so as to sandwich the first fixing portion 123 therebetween in an extending direction of the side plate 12. In this manner, in addition to the above embodiment of arrangement of the first fixing portion 123, forming of the second fixing portion 122 and third fixing portion 124 so as to sandwich the first fixing portion 123 therebetween allows more secure fixing of the shield case to the substrate.

Further, in the present embodiment, the slit 126 is formed between the second fixing portion 122 and a gap 13, and the slit 129 is formed between the third fixing portion 124 and a gap 13. With this configuration, even if a corner portion of the shield case 10 is deformed, force to be applied to the second fixing portion 122 and third fixing portion 124 can be reduced.

Further, in the present embodiment, a first connecting portion 123a is formed at an end portion of the first fixing portion 123 on a side opposite to the top plate 11, a second connecting portion 122a is formed at an end portion of the second fixing portion 122 on a side opposite to the top plate 11, and a third connecting portion 124a is formed at an end portion of the third fixing portion 124 on a side opposite to the top plate 11.

A length of a portion of the first connecting portion 123a that is arranged along the substrate is configured to be longer than a length of a portion of the second connecting portion 122a that is arranged along the substrate and a length of a portion of the third connecting portion 124a that is arranged along the substrate. In this manner, it is possible to achieve both fixation strength of the shield case 10 to the substrate and suppression of excessive enhancement of rigidity of the shield case.

Figure 3:
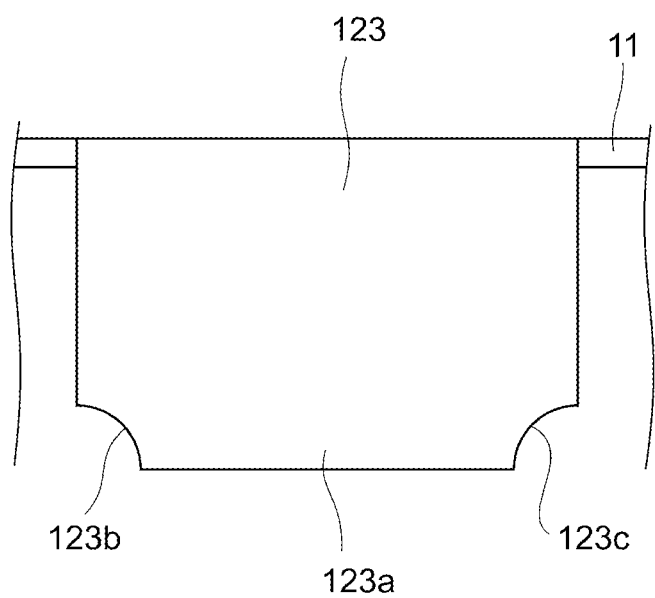
FIG. 3 is an enlarged view illustrating a connecting portion of the shield case shown in FIGS. 1A and 1B.

Further, in the present embodiment, a corner portion of any of the first connecting portion 123a, the second connecting portion 122a, and the third connecting portion 124a is formed into a circular arc shape so as to retreat toward the top plate 11 side in a surface perpendicular to the substrate. This embodiment will be described with reference to FIG. 3, taking the first connecting portion 123a as a representative example. FIG. 3 is a view illustrating, in an enlarged manner, the first connecting portion 123a of the shield case 10 of FIG. 1.

As illustrated in FIG. 3, corner portions 123b and 123c of the first connecting portion 123a are each formed into a circular arc shape so as to retreat to the top plate 11 side in a surface (surface along the paper surface of FIG. 2) perpendicular to the substrate. Accordingly, in each of the corner portion 123b and the corner portion 123c, outside of the circular arc is directed to the top plate 11 side, and the circular arc rises up in an arch shape from the substrate side (lower side of FIG. 2). With this configuration, it is possible to achieve both reduction in the stress concentration which is brought about by forming the corner portions 123b and 123c into a circular arc shape, and solder wetting-up uniformization effect which is brought about by forming the circular arc such that the circular arc retreats to the top plate 11 side in a surface perpendicular to the substrate.

Further, in the present embodiment, both the second connecting portion 122a and the third connecting portion 124a are disposed so as to be closer to a gap 13 side. With this configuration, a distance between the second connecting portion 122a and the third connecting portion 124a can be secured, thereby achieving assurance of stability of a fixing state of the shield case and improvement of resistance to pressure applied from an upper surface of the shield case during mounting and the like.

Figure 4:
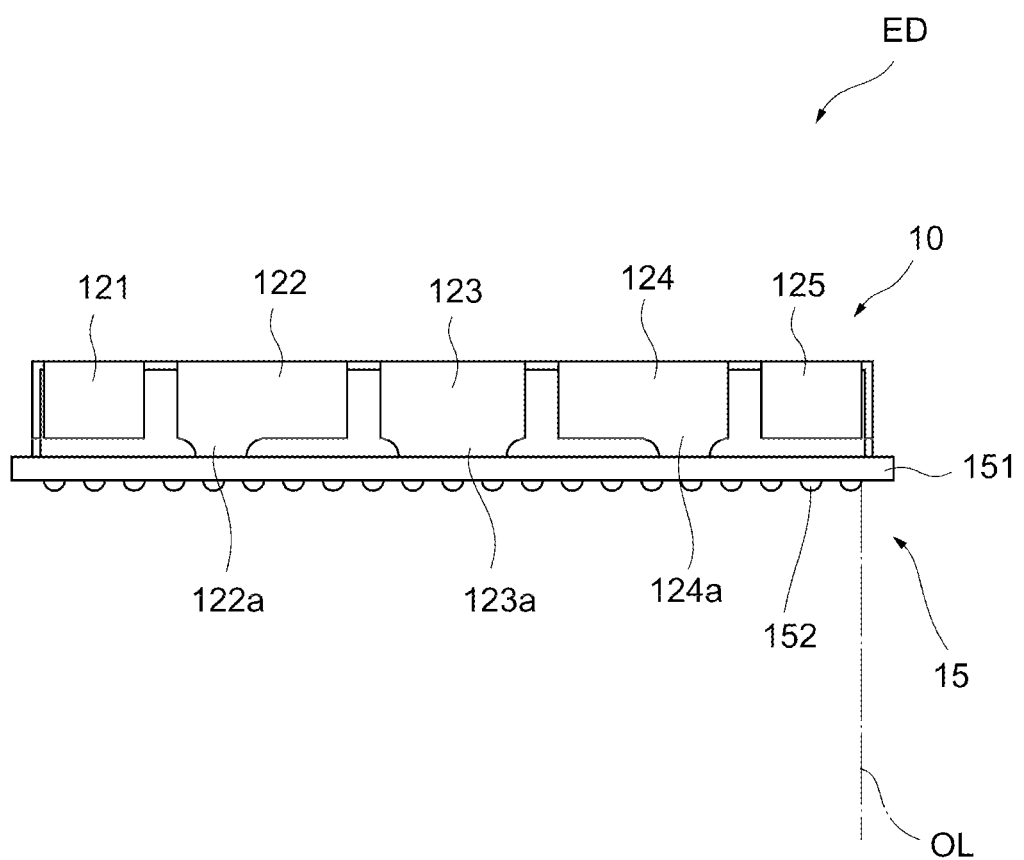
FIG. 4 is a side view illustrating a part of an electronic apparatus in which the shield case shown in FIGS. 1A and 1B is mounted to a substrate.

Further, in the shield case 10 according to the present embodiment, the second connecting portion 122a and the third connecting portions 124a are provided to be positioned inside the outermost part of a terminal electrode disposed on a rear surface of the substrate. This embodiment will be described with reference to FIG. 4. FIG. 4 is a view illustrating a part of an electronic device ED in which the shield case 10 is mounted to a substrate 15.

As illustrated in FIG. 4, the substrate 15 includes a substrate body 151. Electronic parts are mounted on the substrate body 151, and a soldering portion 152 protrudes from the rear surface of the substrate body 151. The second connecting portion 122a and the third connecting portion 124a are each disposed inside an outermost line OL indicating the outermost part of the soldering portion 152 which is the terminal electrode disposed on the rear surface of the substrate 15. With this configuration, when the substrate 15 is distorted with the distortion of the motherboard, it is possible to prevent stress due to influence of the distortion from being transmitted to the second connecting portion 122a and the third connecting portion 124a.

REFERENCE SIGNS LIST

10: shield case
11: top plate
12: side plate
13: gap
15: substrate
121: side end portion
122: second fixing portion
123: first fixing portion
124: third fixing portion
125: side end portion
126: slit
127: slit
128: slit
129: slit
122a: second connecting portion
123a: first connecting portion
124a: third connecting portion
123b: corner portion
123c: corner portion
151: substrate body
152: soldering portion
OL: outermost line

What is claimed is:

1. A shield case formed into a box-like shape and one end being opened having a top plate and a plurality of side plates, adjacent ones of the plurality of side plates being spaced apart from one another to form a gap therebetween, a part of an opened edge of the side plate being fixed to a substrate on which electronic parts are mounted, wherein the side plate has a fixing portion for fixing to the substrate, and at least one pair of slits extending from the opened edge to the top plate and having a tip portion formed in the top plate, the fixing portion being provided in a position sandwiched between each of the at least one pair of slits in the side plate and including a first, second and third fixing portions, the first fixing portion being provided in a center portion of the side plate, the second and third fixing portions being formed so as to sandwich the first fixing portion therebetween in an extending direction of the side plate, wherein a slit is formed between the second fixing portion and the gap and a slit is also formed between the third fixing portion and the gap, and wherein a first connecting portion is formed at an end portion of the first fixing portion on a side opposite to the top plate, a second connecting portion is formed at an end portion of the second fixing portion on a side opposite to the top plate, and a third connecting portion is formed at an end portion of the third fixing portion on a side opposite to the top plate, a length of a portion of the first connecting portion that is arranged along the substrate is longer than a length of a portion of the second connecting portion that is arranged along the substrate and a length of a portion of the third connecting portions that is arranged along the substrate.

2. The shield case as claimed in claim 1, wherein the tip portion is formed into a circular arc shape.

3. The shield case as claimed in claim 1, wherein a corner portion of any of the first connecting portion, the second connecting portion, and the third connecting portion is formed into a circular arc shape so as to retreat toward the top plate side in a surface perpendicular to the substrate.

4. The shield case as claimed in claim 1, wherein the second connecting portion is formed at an end portion of the second fixing portion on a side opposite to the top plate, and the third connecting portion is formed at an end portion of the third fixing portion on a side opposite to the top plate, both the second connecting portion and the third connecting portion are disposed so as to be closer to the gap side.

5. The shield case as claimed in claim 1, wherein the second connecting portion and the third connecting portion are provided to be positioned inside the outermost part of a terminal electrode disposed on a rear surface of the substrate.

6. An electronic apparatus, wherein the shield case as claimed in claim 1 is disposed on the substrate on which electronic parts are mounted so as to cover the electronic parts.

* * * * *